(12) United States Patent
Lim et al.

(10) Patent No.: US 6,399,451 B1
(45) Date of Patent: Jun. 4, 2002

(54) SEMICONDUCTOR DEVICE HAVING GATE SPACER CONTAINING CONDUCTIVE LAYER AND MANUFACTURING METHOD THEREFOR

(75) Inventors: Hoon Lim, Seoul; Joo-young Kim, Suwon; Sun-ha Hwang, Bucheon, all of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/396,698

(22) Filed: Sep. 15, 1999

(30) Foreign Application Priority Data

Sep. 16, 1998 (KR) .............................. 98-38199

(51) Int. Cl.[7] .......................................... H01L 21/336
(52) U.S. Cl. .................... 438/303; 438/304; 438/305; 438/595; 438/596; 257/340; 257/344; 257/377; 257/384
(58) Field of Search ................ 257/340, 377, 257/385; 438/299, 303, 304, 595, 596

(56) References Cited

U.S. PATENT DOCUMENTS

| | | | | |
|---|---|---|---|---|
| 5,498,555 A | * | 3/1996 | Lin .............................. | 437/35 |
| 5,663,586 A | * | 9/1997 | Lin .............................. | 257/336 |
| 5,684,319 A | * | 11/1997 | Hebert ........................ | 257/336 |
| 6,043,545 A | * | 3/2000 | Tseng et al. ................ | 257/408 |

OTHER PUBLICATIONS

Takashi Yoshitomi et al., "A Hot–Carrier Degradation Mechanism and Electrical Characteristics in S4D n–MOSFET", pp. 2053–2058, IEEE Transactions on Electron Devices, vol. 44, No. 11, Nov. 1997.

* cited by examiner

Primary Examiner—Douglas Wille
Assistant Examiner—Wai-Sing Louie
(74) Attorney, Agent, or Firm—Marger Johnson & McCollom, P.C.

(57) ABSTRACT

A semiconductor device with a gate spacer containing a conductive layer, and a manufacturing method. A first spacer insulation layer is formed on a semiconductor substrate where a gate electrode is formed. Then, the first spacer insulation layer is etched to cover the side walls of the gate electrode. A conductive spacer film is subsequently formed on the resultant structure and is over-etched to form a conductive spacer that covers the first spacer insulation layer. In this step, the gate electrode is partially consumed to make the top of the first spacer insulation layer higher than the gate electrode. Also, an upper portion of the first spacer insulation layer is not comparatively etched due to an etching selectivity. This structure avoids shorts between the conductive spacer and the gate electrode. A second spacer insulation layer is then formed on the conductive spacer. As a result, degradation of characteristics of the semiconductor device, due to hot electrons trapped within a gate insulation layer and a spacer area, can be suppressed. Also, the silicide layer can be formed on the gate electrode, thereby increasing the operational speed of the semiconductor device.

11 Claims, 3 Drawing Sheets

SEMICONDUCTOR DEVICE HAVING GATE SPACER CONTAINING CONDUCTIVE LAYER AND MANUFACTURING METHOD THEREFOR

BACKGROUND OF THE INVENTION

1. Field of the Invention

The present invention relates to a semiconductor device and a manufacturing method, and more particularly, to a semiconductor device having a gate spacer containing a conductive layer, and a manufacturing method.

2. Description of the Related Art

As a semiconductor device has been highly integrated, the line width of a gate becomes narrower. As a result, reduced channel length in a MOSFET (Metal Oxide Semiconductor Field Effect Transistor) having a LDD (Lightly Doped Drain) structure deteriorates the characteristics of the MOSFET. Such deterioration typically results from degradation of a saturation current characteristic due to hot electrons.

To overcome this problem, a silicide silicon sidewall source/drain structure has been developed, which is disclosed in an article entitled "A Hot-Carrier Degradation Mechanism and Electrical Characteristics in $S^4D$ n-MOSFET", IEEE Transactions on Electron Device, Vol. 44, No. 11, November 1997.

FIG. 1 is a cross-sectional view illustrating a conventional semiconductor device having a gate spacer containing a conductive layer.

Referring to FIG. 1, a gate electrode 55, with a gate insulation layer 53 interposed between a semiconductor substrate 51 and the gate electrode 55, is formed of polysilicon. Side walls of the gate electrode 55 are covered by a spacer insulation layer 57, and the spacer insulation layer 57 is covered by a conductive spacer 59. The conductive spacer 59 is covered by a silicide layer 61 covering the top surface of a source/drain region 65. An insulation layer 63 is formed on the gate electrode 55 to prevent shorts. between the gate electrode 55 and the conductive spacer 59 and/or the silicide layer 61. The insulation layer 63 may be formed of a double layer of oxide and nitride. Reference numeral 67 represents a LDD region formed using the spacer insulation layer as an ion implantation mask.

Generally, when a strong electric field is applied to a semiconductor device, hot electrons generated from a semiconductor substrate are trapped within the gate insulation layer 53 and spacer insulation layer 57 being adjacent to the LDD region 67. The trapped hot electrons reduce mobility of a carrier, thereby deteriorating the characteristics of the semiconductor device, for example, the saturation current. The conductive spacer 59 forms a current path where the hot electrons trapped within the gate insulation layer 53 and spacer insulation layer 57 can escape, thereby preventing degradation of the semiconductor device characteristics. In other words, since the trapped hot electrons escape to the source/drain region 65 or the LDD region 67 through the conductive spacer 59, the deterioration of the characteristics of the semiconductor device due to hot electrons can be suppressed.

However, a conventional semiconductor device has the following disadvantages.

First, in order to prevent the silicide layer 61 and the conductive spacer 59 from being shorted to the gate electrode 55, spacer insulation layer 57 must be formed thinly, and yet, must sufficiently cover the gate electrode 55. These competing requirements are very difficult to implement in a fabrication process.

Second, the insulation layer 63 must be formed to prevent the top surface of the gate electrode 55 from being shorted to the silicide layer 61 and the conductive spacer 59. However, a silicide layer cannot be formed on the gate electrode 55 in such a structure. The lack of a silicide layer causes an increase in delay time when the semiconductor device operates, thereby lowering the operational speed of the semiconductor device.

SUMMARY OF THE INVENTION

To solve the above problems, it is an object of the present invention to provide a semiconductor device having a gate spacer containing a conductive layer, thereby suppressing the degradation of characteristics of the semiconductor device, avoiding shorts between a gate and source/drain, and forming a silicide layer on a gate electrode.

It is another object of the present invention to provide a method for manufacturing the semiconductor device having a gate spacer containing a conductive layer.

Accordingly, to achieve the first object, there is provided a semiconductor device comprising a semiconductor substrate, a gate electrode having a gate insulation layer interposed between the gate electrode and a semiconductor substrate, a source/drain region formed on the semiconductor substrate adjacent the gate electrode, a first spacer insulation layer covering the side walls of the gate electrode, a conductive spacer covering the outer portions of the first spacer insulation layer, a second spacer insulation layer covering the outer portions of the conductive spacer, and silicide layers formed on the gate electrode and the source/drain region.

According to a preferred embodiment of the present invention, the semiconductor substrate is a silicon single crystalline wafer or a silicon on insulator (SOI) type semiconductor substrate. The gate electrode is formed of impurity-doped polysilicon. And the first spacer insulation layer is formed of an oxide layer ($SiO_2$) or a complex layer containing the oxide layer. Also, the conductive spacer is formed of impurity-doped polysilicon and the second spacer insulation layer is formed of a nitride layer or a complex layer containing the nitride layer.

The source/drain region further comprises a lightly doped drain (LDD) region extending to a channel area under the gate electrode. The conductive spacer is electrically connected to the source/drain region.

Also, the silicide layer is formed of cobalt silicide ($CoSi_x$) or titanium silicide ($TiSi_x$).

To achieve the second object, there is provided a method for manufacturing a semiconductor device comprising the steps of forming a gate electrode on a semiconductor substrate where a gate insulation layer is formed, forming a LDD region using the gate electrode as an ion implantation mask, forming a first spacer insulation layer [adjacent] the gate electrode, forming a conductive spacer over at least a portion of the first spacer insulation layer, forming a second spacer insulation layer on the conductive spacer, and forming a silicide layer on the gate electrode and a source/drain region.

Preferably, the gate electrode is formed by depositing a polysilicon layer and patterning the same. The first spacer insulation layer, the conductive spacer and the second spacer insulation layer are formed using anisotropic etching, and the anisotropic etching of the conductive spacer is performed such that the top surface of the gate electrode is partially etched to increase the electrical insulation effect by the first spacer insulation layer.

The conductive spacer is formed using impurity-doped polysilicon. Also, the additional step of forming a source/drain region using the gate electrode having the second insulation spacer as an ion implantation mask is performed, after the step of forming the second spacer insulation layer.

Preferably, the silicide layer is selectively formed by depositing a Co or Ti layer over the entire surface of the semiconductor substrate and performing a rapid temperature annealing (RTA) process thereon.

Here, the RTA process is performed such that the conductive spacer is electrically connected to the source/drain region. Also, the conductive spacer is electrically connected to the source/drain region while the silicide layer on the source/drain region is formed more widely than the silicon exposed to the surface of the semiconductor substrate. Alternatively, the conductive spacer is electrically connected to the source/drain region while impurities from impurity-doped polysilicon forming the conductive spacer is diffused into the LDD region under the gate electrode during the RTA process.

According to the present invention, it is possible to suppress the saturation current characteristic degradation due to hot electrons generated when a strong electric field is applied to a semiconductor device. Also, shorts between a gate and source/drain, which may be caused by using a conductive gate spacer, can be avoided. Also, the operational speed of the semiconductor device is improved by forming a silicide layer on a gate electrode.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

Hereinbelow, a preferred embodiment of the present invention will be described in detail with reference to the accompanying drawings.

FIGS. 2 through 8 are cross-sectional views illustrating a semiconductor device having a gate spacer containing a conductive layer, according to the present invention.

Figure 2:
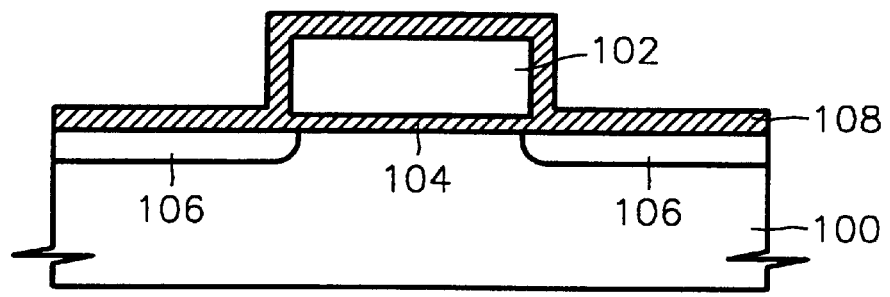
FIGS. 2 through 8 are cross-sectional views illustrating a semiconductor device having a gate spacer containing a conductive layer, according to the present invention.

Referring to FIG. 2, a gate insulation layer 104 is formed on a semiconductor substrate 100, e.g., a single crystalline silicon or silicon on insulator (SOI) type material. An impurity-doped polysilicon layer is then deposited on the gate insulation layer 104 and patterned to form a gate electrode 102. Ion implantation is performed on the semiconductor substrate 100 using the gate electrode 102 as an ion implantation mask to form a lightly doped drain (LDD) region 106. Subsequently, a first spacer insulation layer 108, e.g., an oxide layer ($SiO_2$) or a complex layer containing the oxide layer, is deposited over the entire surface of the semiconductor substrate 100. Also, a first spacer insulation layer 108 may be formed of a complex layer containing an undoped silicate glass (USG) layer.

Figure 3:
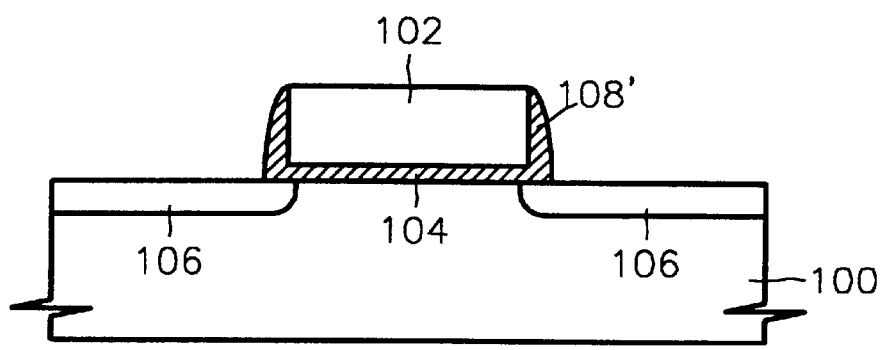

Referring to FIG 3, anisotropic etching is performed on the resultant structure having the first spacer insulation layer 108 to remove the first spacer insulation layer 108 on the LDD region 106 and gate electrode 102, thereby forming the first spacer insulation layer 108' to cover the side walls of the gate electrode 102.

Figure 4:
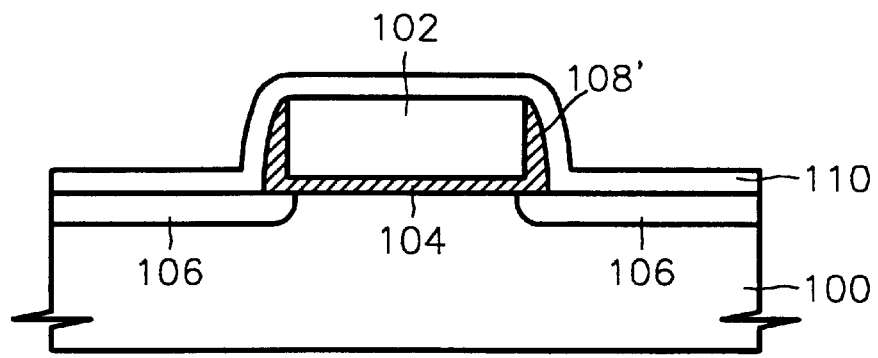

Referring to FIG. 4, a conductive spacer film 110, e.g., a polysilicon layer into which impurities are doped at a dosage of $1 \times 10^{19}$ atoms/$cm^2$ or greater, is deposited over the entire surface of the semiconductor substrate 100 having the first spacer insulation layer 108'.

Figure 5:
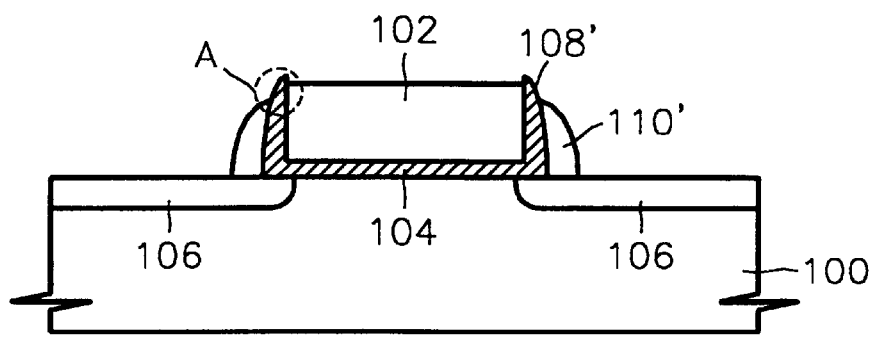

Referring to FIG. 5, anisotropic etching is performed on the conductive spacer film 110 to form the conductive spacer 110' covering the outside of the first spacer insulation layer 108'. The conductive spacer film 110 is over-etched so that the polysilicon gate electrode 102 is partially consumed to make the top of the first spacer insulation layer higher than the gate electrode. An upper portion of the first spacer insulation layer 108', indicated by reference letter A, is not comparatively etched due to an etching selectivity difference between polysilicon and oxide. Thus, the anisotropic etching step increases the insulation effect between the conductive spacer 110' and the gate electrode 102, thereby suppressing shorts therebetween.

Figure 6:
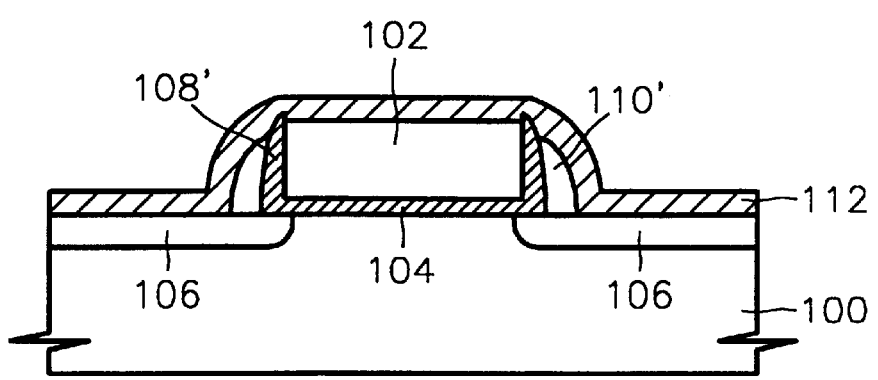

Referring to FIG. 6, a second spacer insulation layer 112 is deposited to a thickness of 100–500 Å over the entire surface of the semiconductor substrate 100 having the conductive spacer 110'. The second spacer insulation layer 112 may be formed of a nitride layer or a complex layer containing the nitride layer.

Figure 7:
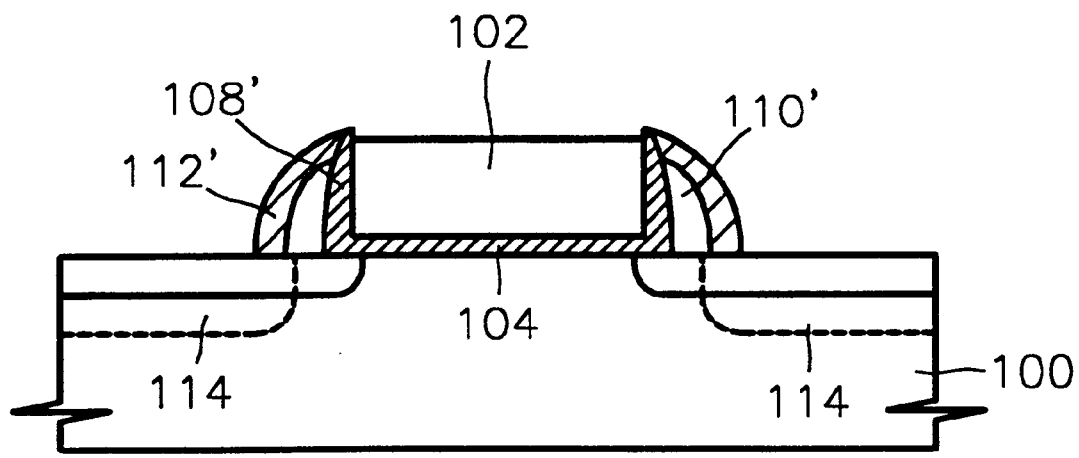

Referring to FIG. 7, anisotropic etching is performed on the second spacer insulation layer 112 formed of the nitride layer to form the second spacer insulation layer 112' completely covering the conductive spacer 110'. Subsequently, ion implantation is performed on the semiconductor substrate 100 using the gate electrode 102 having the second spacer insulation layer 112' as an ion implantation mask to form a source/drain region 114 having a junction depth greater than that of the LDD region 106.

Figure 8:
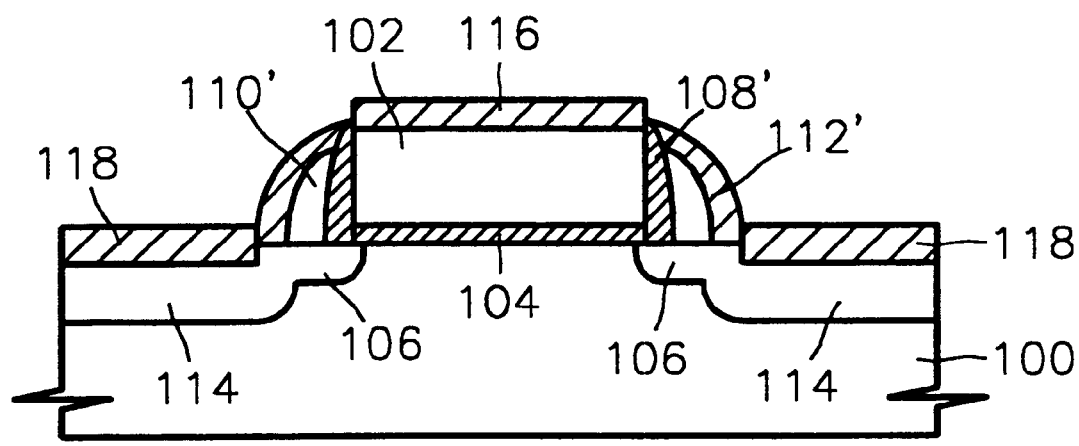

Referring to FIG. 8, a metal layer for forming a silicide layer 118, e.g., Co or Ti, is deposited over the entire surface of the semiconductor substrate 100 having the second spacer insulation layer 112'. Then, rapid thermal annealing (RTA) is performed thereon. The RTA causes silicidation on the top surface of the gate electrode 102 and the source/drain region 114, which is formed of silicon, so that the metal layer is turned into a silicide layer (116, 118). The silicidation does not occur in a spacer area surrounded by the second spacer insulation layer 112'. The metal layer, e.g., Co or Ti, can be easily removed in a subsequent cleaning process.

Here, the RTA is preferably performed such that the conductive spacer 110' is electrically connected to the LDD region 106 or the source/drain region 114. In other words, performance of the RTA at 850° C. for 60 seconds grows a silicide layer 118 downward from the source/drain region 114 to a depth of about 500 Å, and laterally to a width of about 300 Å. As a result, the silicide layer 118 on the source/drain 114 is enlarged in the direction of the LDD area and is physically connected to the conductive spacer 110'. Consequently, the LDD region 106 can be electrically connected to the conductive spacer 110'.

Various processing conditions of the RTA can be controlled so that polysilicon impurities, doped at a high concentration of $1 \times 10^{19}$ atoms/$cm^2$ or greater, for forming the conductive spacer 110', are diffused into the LDD region 106 to connect the source/drain region 114 with conductor spacer 110'.

Hereinbelow, the structure and characteristics of the semiconductor device having a gate spacer containing a conductive layer according to the present invention will be described with reference to FIG. 8.

The semiconductor device having a gate spacer containing a conductive layer according to the present invention includes a semiconductor substrate 100, a gate electrode 102, a gate insulation layer 104 interposed between the gate electrode and a predetermined portion of the semiconductor substrate 100, a LDD region 106 and a source/drain region 114 formed on the semiconductor substrate 100 adjacent the gate electrode 102, a first spacer insulation layer 108' covering the side walls of the gate electrode 102, a conductive spacer 110' covering the outside of the first spacer insulation layer 108', a second spacer insulation layer 112' covering the outside of the conductive spacer 110', and silicide layers 116 and 118 formed on the gate electrode 102 and the source/drain region 114.

Figure 1:
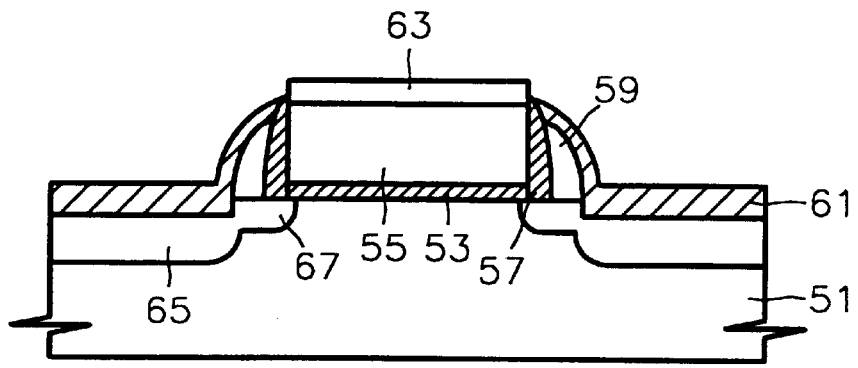
FIG. 1 is a cross-sectional view illustrating a conventional semiconductor device having a gate spacer containing a conductive layer.

The conductive spacer 110' between the first spacer insulation layer 108' and the second spacer insulation layer 112' prevents the saturation current characteristics from being degraded by hot electrons, electrons generated when a strong electric field is applied to a semiconductor device, and subsequently trapped within a gate insulation layer and a spacer. Also, the conductive spacer 110' provides a current path through which the hot electrons can escape to the LDD region 106 or the source/drain region 114. The upper portion of the first spacer insulation layer 108' exposed by over-etching solves any shorting problem between the gate electrode 102 and the source/drain region 114. Finally, the silicide layer 116 formed on the gate electrode 102 as well as on the source/drain region 114 improves delay time characteristics when the semiconductor device operates, compared to the conventional art in which the top surface of the gate electrode (55 of FIG. 1) is formed of an insulation layer, thereby increasing the operational speed of the semiconductor device.

Therefore, according to the present invention, first, degradation of a saturation current characteristic due to hot electrons can be suppressed. Second, shorts between a gate and source/drain can be avoided. Third, the operational speed of the semiconductor device can be improved by forming a silicide layer on a gate electrode as well as on the source/drain region.

The present invention is not limited to the above-described embodiment, and many modifications and changes can be made by one skilled in the art within the spirit and scope of the invention.

What is claimed is:

1. A method for manufacturing a semiconductor device comprising:

providing a semiconductor substrate;

forming a gate insulation layer on the substrate;

forming a gate electrode on the gate insulation layer;

forming a LDD region using the gate electrode as an ion implantation mask;

forming a first spacer insulation layer adjacent the gate electrode;

forming a conductive spacer on at least a portion of the first spacer insulation layer;

electrically isolating the conductive spacer from the gate electrode by forming a second spacer insulation layer on the conductive spacer; and forming a silicide layer on the gate electrode and a source/drain region, wherein the conductive spacer is electrically connected to the source/drain region to provide a current path through which hot electrons can escape to the source/drain region.

2. The method according to claim 1, wherein the gate electrode is formed by depositing a polysilicon layer and patterning the polysilicon layer.

3. The method according to claim 1, wherein the first spacer insulation layer, the conductive spacer and the second spacer insulation layer are formed using anisotropic etching.

4. The method according to claim 3, wherein the anisotropic etching of the conductive spacer is performed such that the top surface of the gate electrode is partially etched to make a top of the first spacer insulation layer higher than the gate electrode to increase the electrical isolation between the conductive spacer and the gate electrode.

5. The method according to claim 1, wherein the conductive spacer is formed using impurity-doped polysilicon.

6. The method according to claim 1, further comprising the step of forming a source/drain region using the gate electrode having the second insulation spacer as an ion implantation mask, after the step of forming the second spacer insulation layer.

7. The method according to claim 1, wherein the silicide layer is selectively formed by depositing a Co or Ti layer over the entire surface of the semiconductor substrate and performing a rapid temperature annealing (RTA) process thereon.

8. The method according to claim 1, wherein the conductive spacer is electrically connected to the source/drain region while the silicide layer on the source/drain region is formed more widely than the silicon exposed to the surface of the semiconductor substrate.

9. The method according to claim 1, wherein the conductive spacer is electrically connected to the source/drain region while impurities from impurity-doped polysilicon forming the conductive spacer are diffused into the LDD region under the gate electrode during the RTA process.

10. The method of claim 4, wherein said partial etching of the gate electrode comprises over-etching the gate electrode with an etching selectivity between the gate electrode and the first spacer insulation layer.

11. A method for manufacturing a semiconductor device comprising:

providing a semiconductor substrate;

forming a gate insulation layer on the substrate;

forming a gate electrode on the gate insulation layer;

forming an impurity region along opposite sides of the gate electrode;

forming a first spacer insulation layer adjacent the gate electrode;

forming a conductive spacer on at least a portion of the first spacer insulation layer;

forming a second spacer insulation layer on the conductive spacer to electrically isolate the conductive spacer from the gate electrode; and forming a silicide layer on the gate electrode and a source/drain region wherein the conductive spacer is electrically connected to the impurity region to provide a current path through which hot electrons can escape to the impurity region.

* * * * *